United States Patent
Kim et al.

(10) Patent No.: US 10,595,394 B1
(45) Date of Patent: Mar. 17, 2020

(54) PCB WITH MINIMIZED CROSSTALK

(71) Applicant: Cray Inc., Seattle, WA (US)

(72) Inventors: Hyunjun Kim, Mercer Island, WA (US); Paul Wildes, Eau Claire, WI (US); Andy Becker, Eau Claire, WI (US); Shawn Utz, Kent, WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 16/407,721

(22) Filed: May 9, 2019

(51) Int. Cl.
*H05K 1/02* (2006.01)
*H05K 1/11* (2006.01)

(52) U.S. Cl.
CPC ......... *H05K 1/0222* (2013.01); *H05K 1/0243* (2013.01); *H05K 1/0245* (2013.01); *H05K 1/113* (2013.01); *H05K 2201/09409* (2013.01); *H05K 2201/09609* (2013.01); *H05K 2201/09636* (2013.01); *H05K 2201/10734* (2013.01)

(58) Field of Classification Search
CPC .. H05K 1/0222; H05K 1/0243; H05K 1/0245; H05K 1/113

USPC ......................................................... 174/264
See application file for complete search history.

(56) References Cited

U.S. PATENT DOCUMENTS

| | | | |
|---|---|---|---|
| 2009/0243756 A1* | 10/2009 | Stevenson | H03H 7/1766 333/172 |
| 2016/0302301 A1* | 10/2016 | Kim | H05K 1/0216 |
| 2018/0098441 A1* | 4/2018 | Truong | G06F 1/20 |
| 2019/0122993 A1* | 4/2019 | Kim | H01L 24/24 |
| 2019/0207286 A1* | 7/2019 | Moallem | H05K 1/115 |

\* cited by examiner

*Primary Examiner* — Tremesha S Willis

(57) ABSTRACT

A printed circuit board includes additional stitching vias placed at strategic location within a connection matrix, which provides additional isolation and further accommodates high-speed communication capabilities. The stitching vias have a variable length or depth, depending on related structures within the circuit board, so as to avoid any interference with underlining escape routing, or alternative signal transmission structures. More specifically, these stitching vias help to eliminate cross-talk in the via field caused by the close proximity of signal carrying structures. Further, differential signal communication is better accommodated based upon this reduction in cross-talk.

21 Claims, 4 Drawing Sheets

29 mil 75 mil 97 mil 130 mil

PCB WITH MINIMIZED CROSSTALK

BACKGROUND

In the design of high-speed interconnects, the level of unwanted electrical crosstalk between adjacent signals is one metric used when characterizing communication channels. In practice, this crosstalk is a portion of overall noise, which normally results in increased bounded uncorrelated jitter (BUJ). In a printed circuit board (PCB) one source of crosstalk inherently exists in a via field beneath a typical integrated circuit (IC). As is well recognized, one common structure used to provide connectivity to the IC is a ball grid array (BGA) which is used to connect signal contacts on a bottom side of the IC to related structures within the PCB. This requires a grid-like via field as part of the PCB, which is appropriately positioned and sized to cooperate/communicate with the IC. A number of solutions exist to minimize crosstalk within this via field structure, including increasing in the separation between signals (i.e. employing larger via pitch and trace spacing), and adding ground vias or guard traces between signals.

It is understood that crosstalk within a via field is generally related to the length of the associated via barrel, which typically extends from top to bottom of the PCB. A thicker PCB is expected to create a higher lateral near-end and far-end crosstalk (NEXT and FEXT) from longer vias which are located nearby (either to the left or right, or diagonally below). The level of crosstalk is proportional to the length of the adjacent vias.

In recently adopted PAM4 multi-level signaling applications, having communication channels operating at very high data rates (56 Gbps), crosstalk plays a more critical role in the signal integrity of the channel. Industry experts agree that these high-speed channels becomes more sensitive to crosstalk and other impairments, as compared to more conventional non-return to zero (NRZ) data communication signaling. Crosstalk (NEXT and FEXT) can degrade these advanced data channels by a factor of 6 to 9 according to industry experts, a direct result of employing this very sensitive multi-level PAM4 signaling. This is partly because of a greatly reduced (by ⅓) step-height, but is also a result of the large variation in rise and fall times of these multi-level signals, both factors which are inherent to the nature of PAM4 technology. As such designing a high-speed communication channel with minimized crosstalk is a key technology improvement, essential to the successful product development and implementation of modern high-speed multi-level signaling systems.

SUMMARY

In an effort to minimize crosstalk in printed circuit board designs which make use of a complex via field, several strategically placed stitching vias are included. These stitching vias are placed diagonally between various sets of signal transmission pairs, and thus help to eliminate any crosstalk within the PCB itself. Furthermore, the length of the stitching via can also help to fit the particular board structure to help minimize crosstalk in most circumstances. All of these factors combine with one another to provide a more effective and efficient communications scheme.

BRIEF DESCRIPTION OF THE DRAWINGS

Various advantages and features of the preferred embodiments will be apparent from reading the following detailed description in conjunction with the drawings in which.

DESCRIPTION

In many situations, a processor or ASIC package (i.e. an integrated circuit or IC) has a bottom side footprint which requires a via array on the underlying PCB to provide necessary connectivity. Unfortunately the vias are also a primary source of crosstalk in communication systems. These via arrays are typically located in a rectangular grid, and are separated by approximately 1 mm in both the X and Y directions. Within the PCB, narrow signal traces are routed and escaped from these via fields, travelling to the outside of the package/socket area, and then fanned out to other areas of the PCB.

Figure 1A:
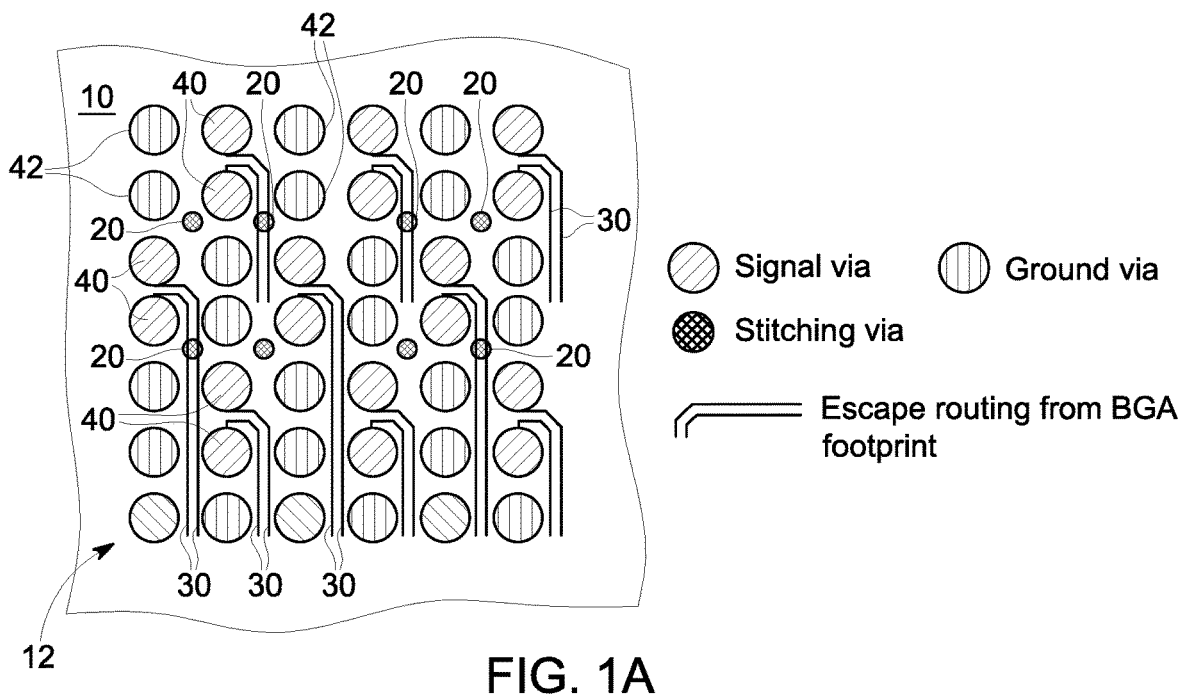
FIGS. 1A-1C are various views of an exemplary BGA footprint with FIG. 1A being a top view, FIG. 1B being a 3-D model view, and FIG. 1C being a transparent side view showing escape signal traces and added stitching vias between signal vias.
Figure 1B:
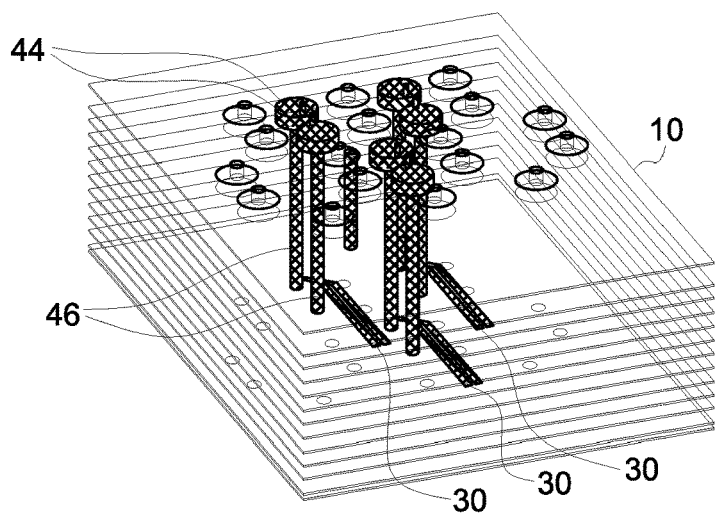
Figure 1C:
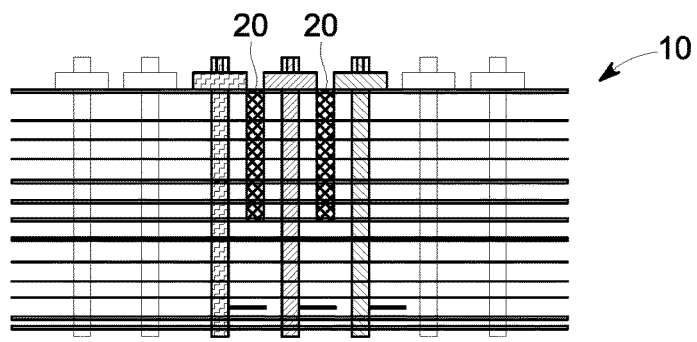

Turning now to FIGS. 1A-1C, one approach to cross-talk minimization in PCBs is generally illustrated. As mentioned above, the typical via array provides connectivity within the PCB. Here, a PCB 10 is partially illustrated. As best shown in FIG. 1A, PCB 10 includes a via array 12 which has a plurality of signal vias 40 specifically positioned to receive and communicate signals from the IC (not shown). To provide isolation and separation, a plurality of ground vias 42 are also included. In this embodiment, the pairs of signal vias 40 and pairs of ground vias 42 are alternated. As is well recognized, the use of signal via pairs 40 allows for the communication of differential signals, thus increasing the efficiency and effectiveness of the communication paths involved. To provide a further mechanism which eliminates crosstalk, a number of stitching vias 20 are added to the array 12. More specifically PCB 10 includes a plurality of thru-hole ground stitching vias 20, which are inserted diagonally between adjacent signal pairs 40. In certain circumstances, added stitching vias 20 can mechanically interfere with the existing escape trace routing, thus accommodations are necessary. To avoid this interference, it is desirable to have stitching vias 20 with a limited barrel length. Some examples of these various lengths are best depicted in FIGS. 3A-3D, which also shows how a plurality of escape traces 30 can be routed on the subsequent PCB layers (i.e., below the stitching vias 20).

FIG. 1B illustrates a transparent perspective view, showing only a few of the signal vias 40 and related structures. In this embodiment, signal vias 40 include a pad or BGA ball 44, and a post-like connection structure 46. Post structure 46 provides the communication mechanism which allows signals to be transmitted to respective escape traces 30 located within PCB 10. Again, these structures are well recognized and understood by those skilled in the art as a common mechanism to carry signals within a PCB. As illustrated in FIG. 1C, stitching vias 20 are placed at prescribed locations adjacent to signal via pairs 40. Further, it is contemplated that stitching vias 20 will extend a prescribed distance through the circuit board, thus avoiding interference while also providing appropriate isolation.

Figure 2:
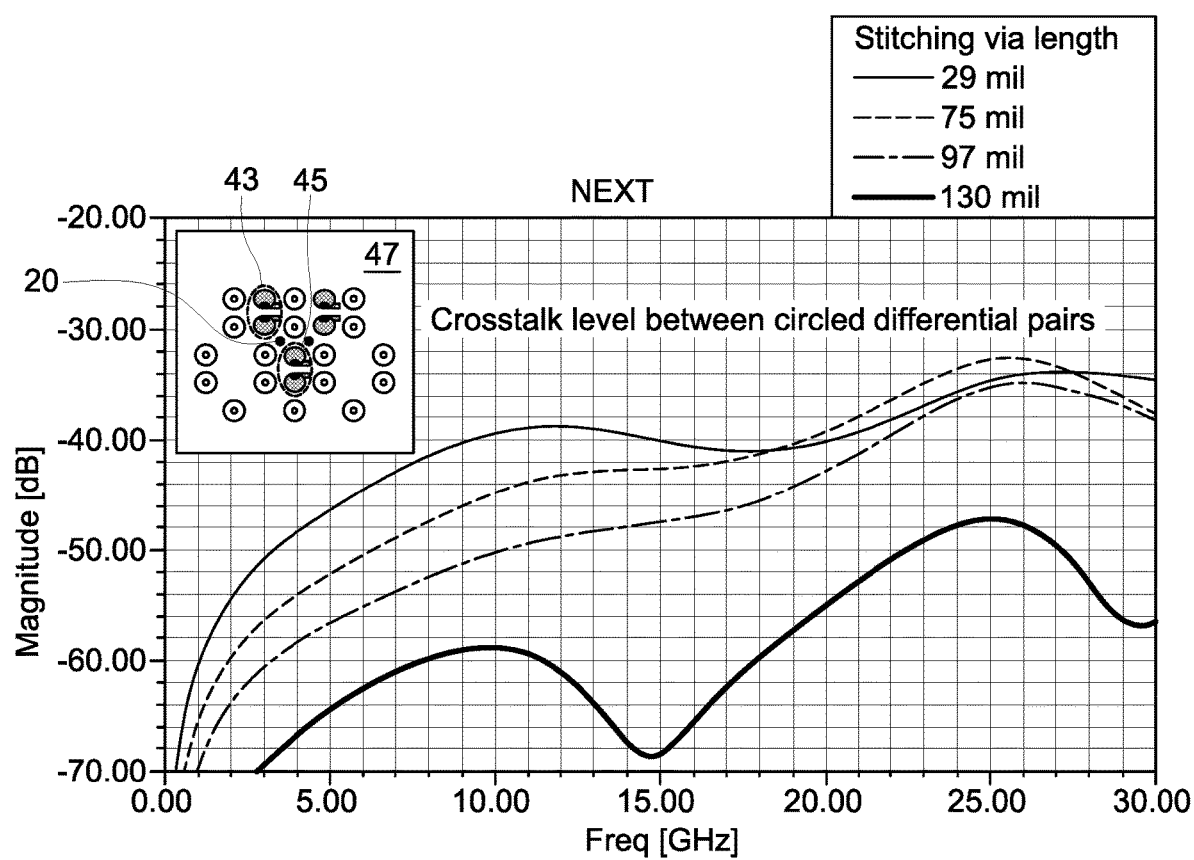
FIG. 2 is a graphical illustration of the near-end crosstalk (NEXT) values measured between signal pairs for various alternative PCB configurations.

As shown in FIG. 2, the level/amount of cross-talk can be reduced by the inclusion of stitching vias. Stated differently, the simulation results shown in FIG. 2 clearly illustrate the benefits of employing stitching vias 20 as an additional electromagnetic barrier. The effect of the length of stitching and signal vias on crosstalk performance is clearly evident in these simulation results. More specifically, FIG. 2 shows the level of crosstalk between a first differential pair 43 and a second differential pair 45, as illustrated in the example layout 47, when stitching vias 20 have varied lengths. As illustrated, the length of the stitching via does create a noticeable effect on the level of crosstalk (NEXT).

Figure 3A:
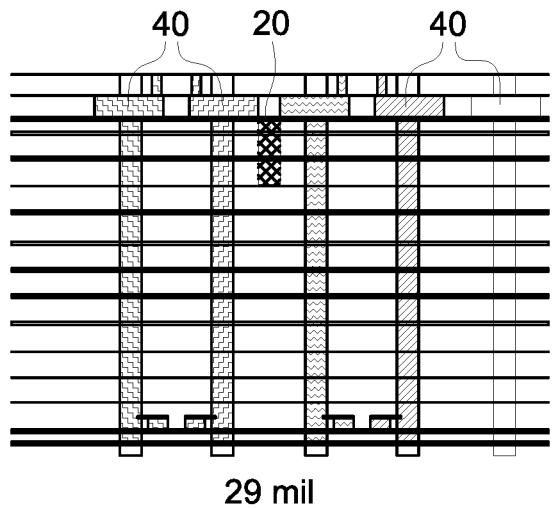
FIGS. 3A-3D are partial cross-sectional views of a PCB, with the exemplary stitching vias of different lengths.
Figure 3B:
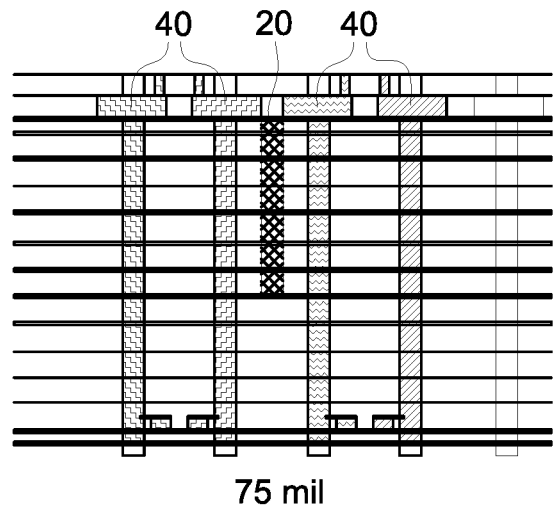
Figure 3C:
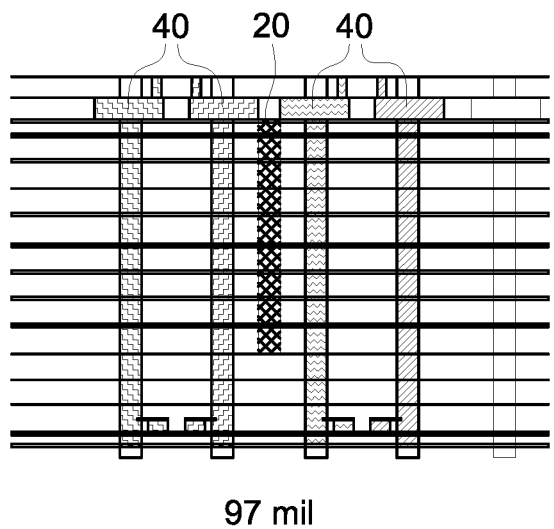
Figure 3D:
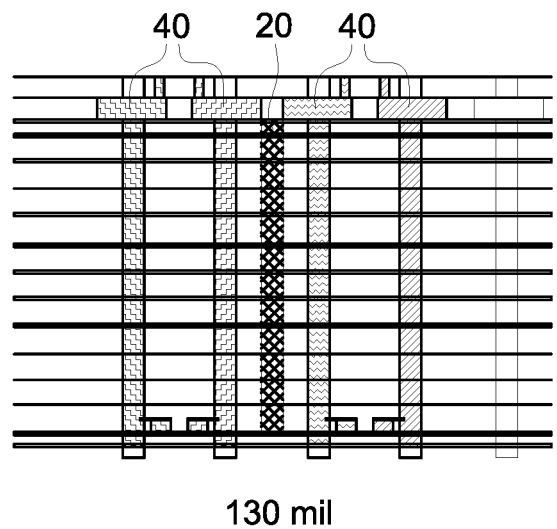

FIGS. 3A-3D illustrate various configurations of stitching vias 20 in use. As illustrated, the depth of each stitching via 20 is varied depending on the particular embodiment involved. As illustrated, FIG. 3A shows a stitching via depth of 29 mils., FIG. 3B shows a stitching via depth of 75 mils., FIG. 3C shows a stitching vias depth of 97 mils., and FIG. 3D shows a stitching via depth of 130 mils. Again, these various embodiments correlate to the crosstalk simulations illustrated in FIG. 2, and show how varying the stitching via length will change crosstalk levels.

Figure 4:
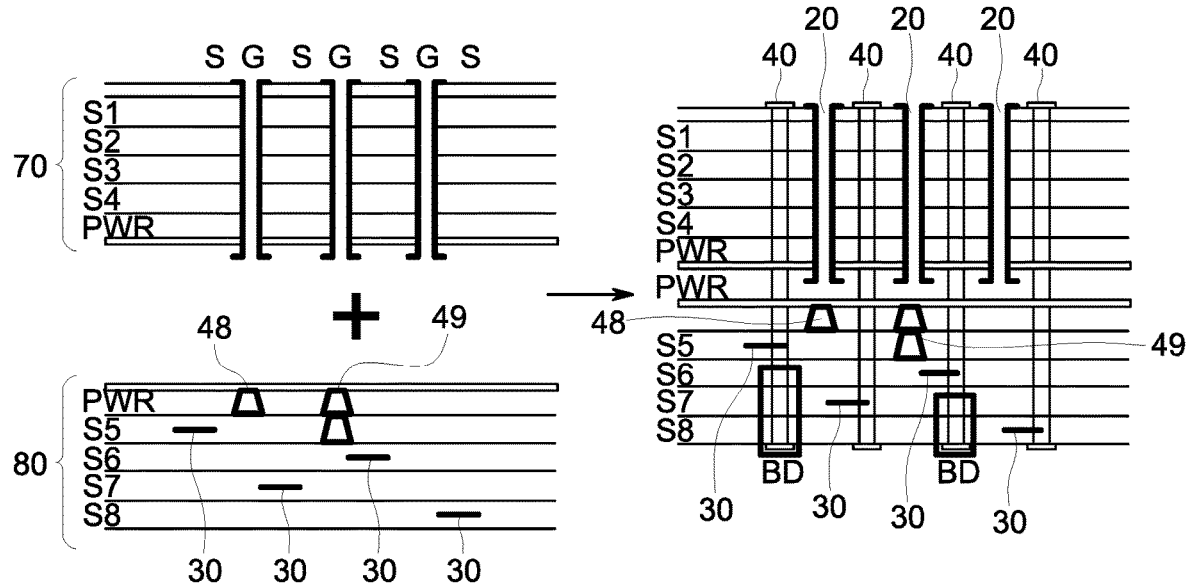
FIG. 4 shows a two-step sequential lamination process for forming a PCB, where stitching vias and traces are first defined and the drill and plating of signal and ground vias are complete after a merge.

As discussed, the embodiments outlined above provide crosstalk reduction, using stitching vias 20 of arbitrary lengths created by a multi-stage PCB fabrication process, in order to avoid interfering with escape traces. As better shown in FIGS. 4 and 5, an upper portion 70 of PCB 10 has only stitching vias 20 defined therein, while bottom portion 80 of PCB 10 has traces 30 etched and routed. After merging these two separate PCB portions 70 and 80, the remaining signal vias 40 and ground vias 42 are drilled and plated. Micro-vias 48 or stacked vias 49 can also be added in the bottom layers before merging, resulting in more isolation and a greater reduction in crosstalk. Back-drilling (BD) of the signal vias 40 can also be applied as a final step, thus further reducing crosstalk and unwanted reasonances due to long via sub.

Figure 5:
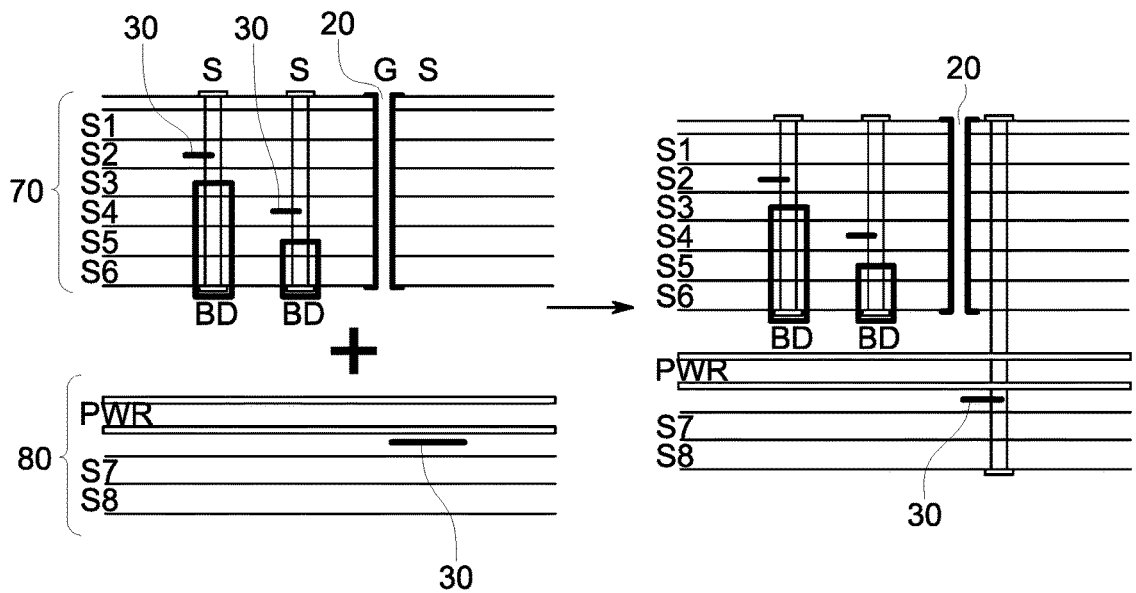
FIG. 5 presents a second two-step sequential lamination process, where drilling/plating of signals and stitching vias can be defined before a merge.

FIG. 5 shows another example where the signal routes 30 are defined both in the upper 70 and lower portion 80 of PCB 10. In this case, signal vias 40 associated with upper portion 70 have routings which are drilled, plated, routed and back-drilled (BD), and stitching vias 20 are formed before merging the two halves. This also provides more room for lower layer routings. In this embodiment, the stitching vias 20 are employed only where long signal vias 40 (in the bottom portion 80 routing section) are present. Applications are not limited to two-stage construction and can be extended to multi-stage processes, depending on various BGA pinout schemes to be employed.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

The invention claimed is:

1. A printed circuit board configured to accommodate high speed data transmission between an integrated circuit mounted thereon and related components, the circuit board comprising:

a pad matrix on a surface of the printed circuit board configured to accommodate attachment of the integrated circuit to the circuit board by a ball grid array, the pad matrix comprising a plurality of signal pads and a plurality of ground pads;

a plurality of signal vias extending from and connected to the plurality of signal pads thus forming a plurality of signal carrying structures for carrying signals to a plurality of respective predetermined layers within the printed circuit board to carry related signals from the surface of the printed circuit board to the respective predetermined layers so the signals can thus be transmitted to the related components by corresponding signal traces that exist on the respective predetermined layers;

a plurality of ground vias extending from and connected to the plurality of ground pads to form a plurality of ground structures, the plurality of ground vias extending a predetermined distance into the printed circuit board, wherein the plurality of signal vias and the plurality of ground vias form a via matrix and are interspersed with one another in a predetermined pattern thereby allowing a number of the plurality of ground vias to be situated between a number of adjacent signal vias; and a plurality of stitching vias placed within the via matrix, to provide further separation between signal vias, each of the plurality of stitching vias extending from the board surface to a predetermined distance within the circuit board in a manner to avoid interference with any corresponding signal traces.

2. The printed circuit board of claim 1 wherein the signal structures are arranged as adjacent pairs thus accommodating differential signal transmission.

3. The printed circuit board of claim 2 wherein the ground structures are arranged in adjacent pairs.

4. The printed circuit board of claim 3 wherein the adjacent pairs of signal structures and the adjacent pairs of ground structures are arranged in a grid matrix having a plurality of rows and columns, and wherein the stitching vias are positioned between the rows or between the columns.

5. The printed circuit board of claim 4 wherein the columns of the grid matrix adjacent comprise alternating pairs of signal structures and pairs of ground structures, and the rows of the grid matrix structure comprise alternating ground structures and signal structures.

6. The printed circuit board of claim 5 wherein the stitching vias are positioned diagonally between immediately diagonally adjacent signal structures.

7. The printed circuit board of claim 1 wherein at least one of the plurality of stitching vias extend through the printed circuit board from the surface to an opposite surface.

8. The printed circuit board of claim 1 at least one of the plurality of stitching vias have a limited length and do not extend completely through from the surface to an opposite surface.

9. The printed circuit board of claim 8 having an upper portion and a lower portion which are merged, wherein the upper portion has the at least one stitching via extending therethrough, and wherein the upper portion and lower portion are merged.

10. The printed circuit board of claim 9 wherein the lower portion has microvias therein.

11. The printed circuit board of claim 10 wherein the microvias are position on an upper surface of the lower portion thus becoming imbedded when the upper portion and the lower portion are merged.

12. A printed circuit board for supporting electronic components and accommodating high speed data differential communication therebetween, the circuit board comprising:
- a plurality of connection pads positioned on an upper surface of the printed circuit board in a predetermined arrangement thereby allowing contact between a first electronic component and the plurality of connection pads via a ball grid array, the plurality of connection pads comprising a plurality of signal pads and a plurality of ground pads, with the plurality of signal pads being arranged in pairs;
- a plurality of pairs of signal vias extending from and connected to the plurality of signal pads thus forming a plurality of signal carrying structures for carrying signals to a plurality of respective predetermined layers within the printed circuit board;
- a plurality of signal traces positioned upon the respective predetermined layers of the printed circuit board and electrically coupled to the related signal vias to thus allow the differential signals to be transmitted through the plurality of signal traces;
- a plurality of ground vias extending from and connected to the plurality of ground pads to form a plurality of ground structures, the plurality of ground vias extending a predetermined distance into the printed circuit board, wherein the plurality of pairs of signal vias and the plurality of ground vias form a via matrix and are interspersed with one another in a predetermined pattern thereby allowing a number of the plurality of ground vias to be situated adjacent to ones of the pairs of signal vias; and
- a plurality of stitching vias placed within the via matrix, to provide further separation between signal vias, each of the plurality of stitching vias extending from the board surface to a predetermined distance within the circuit board in a manner to avoid interference with any corresponding signal traces.

13. The printed circuit board of claim 12 wherein the ground vias are arranged in adjacent pairs.

14. The printed circuit board of claim 13 wherein the adjacent pairs of signal vias and the adjacent pairs of ground vias are arranged in a grid matrix having a plurality of rows and columns, and wherein the stitching vias are positioned between the rows or between the columns.

15. The printed circuit board of claim 14 wherein the columns of the grid matrix comprise alternating pairs of signal vias and pairs of ground vias, and the rows of the grid matrix structure comprise alternating ground vias and signal vias.

16. The printed circuit board of claim 15 wherein the stitching vias are positioned diagonally between immediately diagonally adjacent pairs of signal vias.

17. The printed circuit board of claim 12 wherein at least one of the plurality of stitching vias extend through the printed circuit board from the surface to an opposite surface.

18. The printed circuit board of claim 17 at least one of the plurality of stitching vias have a limited length and do not extend completely through from the surface to an opposite surface.

19. The printed circuit board of claim 18 having an upper portion and a lower portion which are merged, wherein the upper portion has the at least one stitching via extending therethrough, and wherein the upper portion and lower portion are merged.

20. The printed circuit board of claim 19 wherein the lower portion has microvias therein.

21. The printed circuit board of claim 20 wherein the microvias are position on an upper surface of the lower portion thus becoming imbedded when the upper portion and the lower portion are merged.

* * * * *